United States Patent
Ahn et al.

(10) Patent No.: US 9,412,452 B2
(45) Date of Patent: Aug. 9, 2016

(54) SEMICONDUCTOR DEVICE

(71) Applicant: SK hynix Inc., Gyeonggi-do (KR)

(72) Inventors: Jung Ryul Ahn, Gyeonggi-do (KR);
Jum Soo Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/563,592

(22) Filed: Dec. 8, 2014

(65) Prior Publication Data

US 2016/0005466 A1 Jan. 7, 2016

(30) Foreign Application Priority Data

Jul. 4, 2014 (KR) ........................ 10-2014-0083864

(51) Int. Cl.

| G11C 16/10 | (2006.01) |
|---|---|
| G11C 16/04 | (2006.01) |
| G11C 16/28 | (2006.01) |
| G11C 16/26 | (2006.01) |
| G11C 16/14 | (2006.01) |
| G11C 7/14 | (2006.01) |
| G11C 16/34 | (2006.01) |
| G11C 7/02 | (2006.01) |

(52) U.S. Cl.
CPC .............. *G11C 16/0483* (2013.01); *G11C 7/14* (2013.01); *G11C 16/3427* (2013.01); *G11C 7/02* (2013.01); *G11C 16/10* (2013.01); *G11C 16/26* (2013.01); *G11C 16/28* (2013.01)

(58) Field of Classification Search
CPC .... G11C 16/0483; G11C 16/10; G11C 16/26; G11C 16/28; G11C 7/14

USPC .......... 365/185.11, 185.17, 51, 63, 72, 185.2, 365/185.21, 185.29

See application file for complete search history.

(56) References Cited

U.S. PATENT DOCUMENTS

| 7,505,321 B2 * | 3/2009 | Scheuerlein ....... G11C 16/0483 365/185.11 |
|---|---|---|
| 2010/0046294 A1 * | 2/2010 | Jeong ..................... G11C 16/10 365/185.17 |
| 2010/0097862 A1 * | 4/2010 | Kang ................. G11C 16/0483 365/185.17 |

(Continued)

FOREIGN PATENT DOCUMENTS

| KR | 1020100043484 | 4/2010 |
|---|---|---|
| KR | 1020130045622 | 5/2013 |

OTHER PUBLICATIONS

Kim, W., et al., Multi-Layered Vertical Gate NAND Flash Overcoming Stacking Limit for Terabit Density Storage, 2009 Symposium on VLSI Technology Digest of Technical Papers, 188-189.

*Primary Examiner* — Ly D Pham
(74) *Attorney, Agent, or Firm* — IP & T Group LLP (57) ABSTRACT

A semiconductor device includes a first memory string and a second memory string. The first memory string includes a plurality of first main memory cells formed on a pipe transistor of a semiconductor substrate and a plurality of first dummy memory cells connected between the first main memory cells and a common source line. The second memory string includes a plurality of second main memory cells formed on the pipe transistor and a plurality of second dummy memory cells connected between the second main memory cells and a bit line. The number of the second dummy memory cells is greater than the number of the first dummy memory cells.

18 Claims, 4 Drawing Sheets

(56) References Cited

U.S. PATENT DOCUMENTS

| | | | | |
|---|---|---|---|---|
| 2011/0149655 A1* | 6/2011 | Tanzawa | ............ | G11C 16/0483 365/185.17 |
| 2012/0307561 A1* | 12/2012 | Joo | .................... | G11C 16/0483 365/185.17 |
| 2013/0294168 A1* | 11/2013 | Shirakawa | ......... | G11C 16/0483 365/185.17 |
| 2013/0329496 A1* | 12/2013 | Lee | .................... | G11C 16/3445 365/185.11 |
| 2015/0009758 A1* | 1/2015 | Jang | ........................ | G11C 16/24 365/185.17 |
| 2015/0162090 A1* | 6/2015 | Sakui | ..................... | G11C 16/26 365/185.11 |

* cited by examiner

SEMICONDUCTOR DEVICE

CROSS-REFERENCE TO RELATED APPLICATION

The present application claims priority to Korean patent application number 10-2014-0083864, filed on Jul. 4, 2014, the entire disclosure of which is herein incorporated by reference in its entirety.

BACKGROUND

1. Field of the Invention

The present invention relates to a semiconductor device. More specifically, the present invention relates to a semiconductor device including a dummy memory cell.

2. Discussion of Related Art

A NAND flash memory is a representative nonvolatile memory device. The NAND flash memory includes a plurality of memory cells connected between a bit line and a common source line. Memory cells adjacent to the bit line may have different operational characteristics (electrical characteristics) from those adjacent to the common source line. Thus, problems can arise in memory cell operations due to the differences in electrical characteristics.

SUMMARY

The present invention is directed to a semiconductor device capable of improving electrical characteristics.

One aspect of the present invention provides a semiconductor device including a first memory string including a plurality of first main memory cells formed on a pipe transistor of a semiconductor substrate and a plurality of first dummy memory cells connected between the first main memory cells and a common source line, and a second memory string including a plurality of second main memory cells formed on the pipe transistor and a plurality of second dummy memory cells connected between the second main memory cells and a bit line, wherein the number of the second dummy memory cells is greater than the number of the first dummy memory cells.

Another aspect of the present invention provides semiconductor device including a first memory string including a plurality of first main memory cells and a plurality of first dummy memory cells vertically connected between a pipe transistor formed on a semiconductor substrate and a common source line, and a second memory string including a plurality of second main memory cells and a plurality of second dummy memory cells vertically connected between the pipe transistor and a bit line, wherein the number of the first main memory cells is greater than the number of the second main memory cells.

Another aspect of the present invention provides a semiconductor device including a memory block including a plurality of dummy memory cells and a plurality of main memory cells connected between a bit line and a common source line, wherein the number of first dummy memory cells connected to the common source line is smaller than the number of second dummy memory cells connected to the bit line, among the dummy memory cells, and an operation circuit suitable for performing a program loop, a read operation and an erase loop of the main memory cells.

According to the exemplary embodiments of the present invention, electrical characteristics of the semiconductor device may be improved.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

The present invention will be described more fully hereinafter with reference to the accompanying drawings, in which exemplary embodiments of the invention are shown. This invention may, however, be embodied in different forms and should not be construed as limited to the embodiments set forth herein. Exemplary embodiments of the present invention are described below in sufficient detail to enable those of ordinary skill in the art to embody and practice the present invention. Throughout the disclosure, like reference numerals correspond directly to the like numbered parts in the various figures and embodiments.

In this specification, a singular form may include a plural form as long as it is not specifically mentioned in a sentence. Furthermore, 'include/comprise' or 'including/comprising' used in the specification represents that one or more components, steps, operations, and elements exist or are added.

Figure 1:
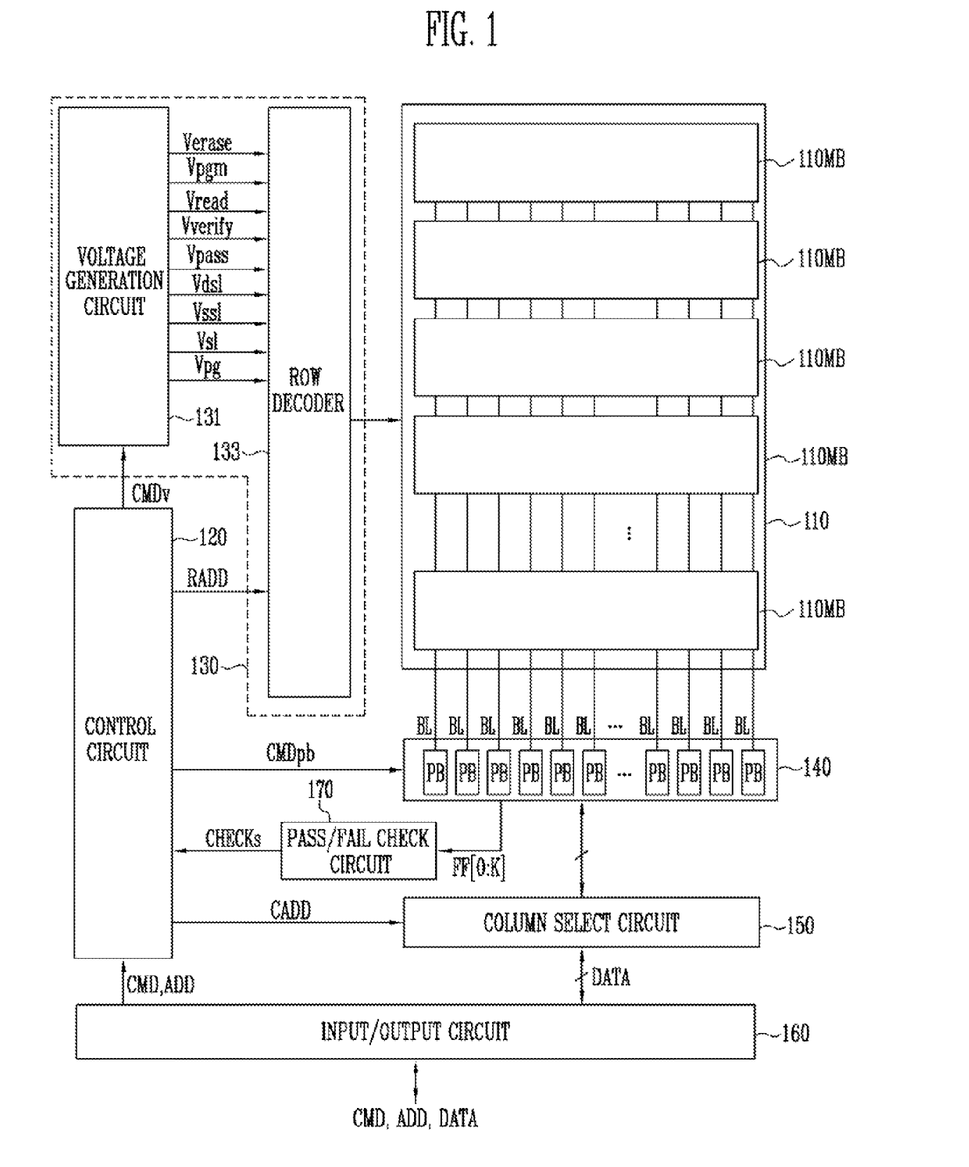
FIG. 1 is a block diagram illustrating a semiconductor device according to an exemplary embodiment of the present invention.

FIG. 1 is a block diagram illustrating a semiconductor device according to an exemplary embodiment of the present invention.

Referring to FIG. 1, the semiconductor device includes a memory array 110 and operation circuits 120 to 170. The memory array 110 includes a plurality of memory blocks 110MB. The memory block 110MB includes a plurality of dummy memory cells and a plurality of main memory cells that are connected between a bit line and a common source line. The number of the dummy memory cells connected to the bit line may be greater than the number of the dummy memory cells connected to the common source line. The structure of the memory block 110MB will be described below.

The operation circuits 120 to 170 perform a program loop, an erase loop and a read operation of memory cells Ce and Co that are connected to a selected word line (for example, WL0). The program loop includes a program operation and a verify operation, and the erase loop includes an erasing operation and a verify operation.

The operation circuits 120 to 170 may perform the program loop, the read operation, and the erase loop of the main memory cells. The operation circuits 120 to 170 may perform the program loop as an increment step pulse program (ISPP) type. That is, the operation circuits 120 to 170 may repeat the program operation and the verify operation until all of the threshold voltages of the memory cells connected to a selected word line reach a reference voltage. Namely, the operation circuits 120 to 170 may repeat the program operation for storing data and the verify operation for verifying the data storage until the externally received data is stored in the memory cells of the selected word line.

The operation circuits 120 to 170 may increase a program voltage Vpgm applied to the selected word line by a predetermined step voltage whenever the program operation repeats. That is, the operation circuits 120 to 170 may apply the program voltage Vpgm, which has a greater level than the program voltage of a previous program operation by the step voltage, to the selected word line.

The operation circuits 120 to 170 precharge bit lines BL for the read operation, and then apply a read voltage Vread a id a pass voltage Vpass to a selected word line and non-selected word lines, respectively. The operation circuits 120 to 170 may detect voltage variation of the bit lines BL and latch the detection result.

The operation circuits 120 to 170 may perform the erase loop as the increment step pulse erase (ISPE) type. That is, the operation circuits 120 to 170 may repeat the erasing operation and the verify operation until all of the threshold voltages of the memory cells of a selected memory block decrease to a reference level.

In order to perform the program loop, the erase loop, and the read operation, the operation circuits 120 to 170 selectively output operation voltages Verase, Vpgm, Vread, Vverify, Vpass, Vdsl, Vssl, Vsl, and Vpg to local lines (for example, word lines, dummy word lines, select lines) of the selected memory block and the common source line. Also, the operation circuits 120 to 170 control precharge/discharge of the bit lines BL, or sense current flow (or voltage variation) of the bit lines BL. For example, an erase voltage Verase may be applied to a bulk (a substrate or a P-well) on which the memory cells are formed during the erasing operation. The program voltage Vpgm may be applied to the selected word line during the program operation. The read voltage may be applied to the selected word line during the read operation. A verify voltage Vverify may be applied to the selected word line during the verify operation. The pass voltage Vpass may be applied to the non-selected word lines during the program operation, the read operation, or the verify operation. A drain select voltage Vdsl may be applied to a drain select line. A source select voltage Vssl may be applied to a source select line. A source voltage Vsl may be applied to the common source line SL. A pipe voltage Vpg may be applied to a gate of a pipe transistor.

In a NAND flash memory device, the operation circuits includes a control circuit 120, a voltage supply circuit 130, a read/write circuit group 140, a column select circuit 150, an input/output circuit 160, and a pass/fail check circuit 170. The above-mentioned elements will be described as follows.

The control circuit 120 outputs a voltage control signal CMDv in response to a command signal CMD that is externally received through the input/output circuit 160. The voltage control signal CMDv controls the voltage supply circuit 130 so that the operation voltages Verase, Vpgm, Vread, Vverify, Vpass, Vdsl, Vssl, Vsl, and Vpg for performing the program loop, the erase loop, and the read operation have predetermined levels. Also, the control circuit 120 outputs control signal CMDpb for performing the program loop, the erase loop, and the read operation. The control signals CMDpb are used to control read/write circuits (or page buffers) PB included in the read/write circuit group 140. In addition, the control circuit 120 receives an address signal ADD to generate a column address signal CADD and a row address signal RADD and output the column address signal CADD and the row address signal RADD.

The voltage supply circuit 130 generates the operation voltages Vease, Vpgm, Vread, Vverify, Vpass, Vdsl, Vssl, Vsl, and Vpg for performing the program loop, the erase loop, and the read operation of the memory cells in response to the voltage control signal CMDv of the control circuit 120. Also, the voltage supply circuit 130 outputs the operation voltages Vease, Vpgm, Vread, Vverify, Vpass, Vdsl, Vssl, Vsl, and Vpg to the local lines (for example, the source select line, the word lines, the drain select line) of the selected memory block and the common source line in response to the row address signal RADD of the control circuit 120.

The voltage supply circuit 130 may include a voltage generation circuit 131 and a row decoder 133. The voltage generation circuit 131 generates the operation voltages Vease, Vpgm, Vread, Vverify, Vpass, Vdsl, Vssl, Vsl, and Vpg in response to the voltage control signal CMDv of the control circuit 120. The row decoder 133 applies the operation voltages Vease, Vpgm, Vread, Vverify, Vpass, Vdsl, Vssl, Vsl, and Vpg to the local lines of the selected memory block of the memory blocks 110MB and the common source line in response to the row address signal RADD of the control circuit 120.

The output and variation of the operation voltages Vease, Vpgm, Vread, Vverify, Vpass, Vdsl, Vssl, Vsl, and Vpg may be performed by the voltage supply circuit 130 based on the voltage control signal CMDv and the row address signal RADD of the control circuit 120.

The read/write circuit group 140 may include a plurality of read/write circuits (for example, page buffers) PB connected to the memory array 110 through the bit lines BL. In particular, the read/write circuits PB may be connected to the bit lines BL. That is, one bit line BL is connected to one read/write circuit PB. Also, each of the read/write circuits PB may be connected to a pair of bit lines BL.

In the program operation, the read/write circuits PB may selectively precharge the bit lines BL based on the control signal CMDpb and data DATA to be stored in the memory cells. In the verify operation or the read operation, the read/write circuits PB may precharge the bit lines BL and sense the voltage or current variation of the bit lines BL to latch the data read from the memory cell, in response to the control signal CMDpb of the control circuit 120.

The read/write circuits PB may output pass/fail signals FF[0:K] to the pass/fail check circuit 170 based on the data (or the threshold voltages of the memory cells checked by the verify operation) read from the memory cells in the verify operation. The pass/fail signals FF[0:K] are used for checking program pass/fail or erase pass/fail of the memory cells. Thus, the read/write circuits PB may include a plurality of latch circuits. The latch circuits may temporarily store data to be stored in the memory cells and the verification result of the memory cells.

The column select circuit 150 selects the read/write circuits PB of the read/write circuit group 140 in response to the column address CADD outputted from the control circuit 120. That is, the column select circuit 150 sequentially transmits the data to be stored in the memory cells to the read/write circuits PB in response to the column address CADD. Also, the column select circuit 150 may sequentially select the read/write circuits PB in response to the column address CADD so that the data of the memory cells, which is latched by the read operation of the read/write circuits PB, is outputted.

The input/output circuit 160 transmits externally inputted command signals CMD and address signals ADD to the control circuit 120. Also, the input/output circuit 160 transmits externally inputted data DATA to the column select circuit 150 during the program operation, or outputs the data read from the memory cells to an outside (e.g. an external device) during the read operation.

The pass/fail check circuit 170 may sense the amount of current that may be changed based on the check signals FF[0:K]. The check signals FF[0:K] are outputted from the read/write circuits PB after the verify operation for determining pass/fail of the program operation. The pass/fail check circuit 170 outputs a check result signal CHECKS to the control circuit 120 based on the check signals FF[0:K]. The control circuit 120 may a have different operation condition at a next program operation based on the check result signal CHECKS.

Figure 2:
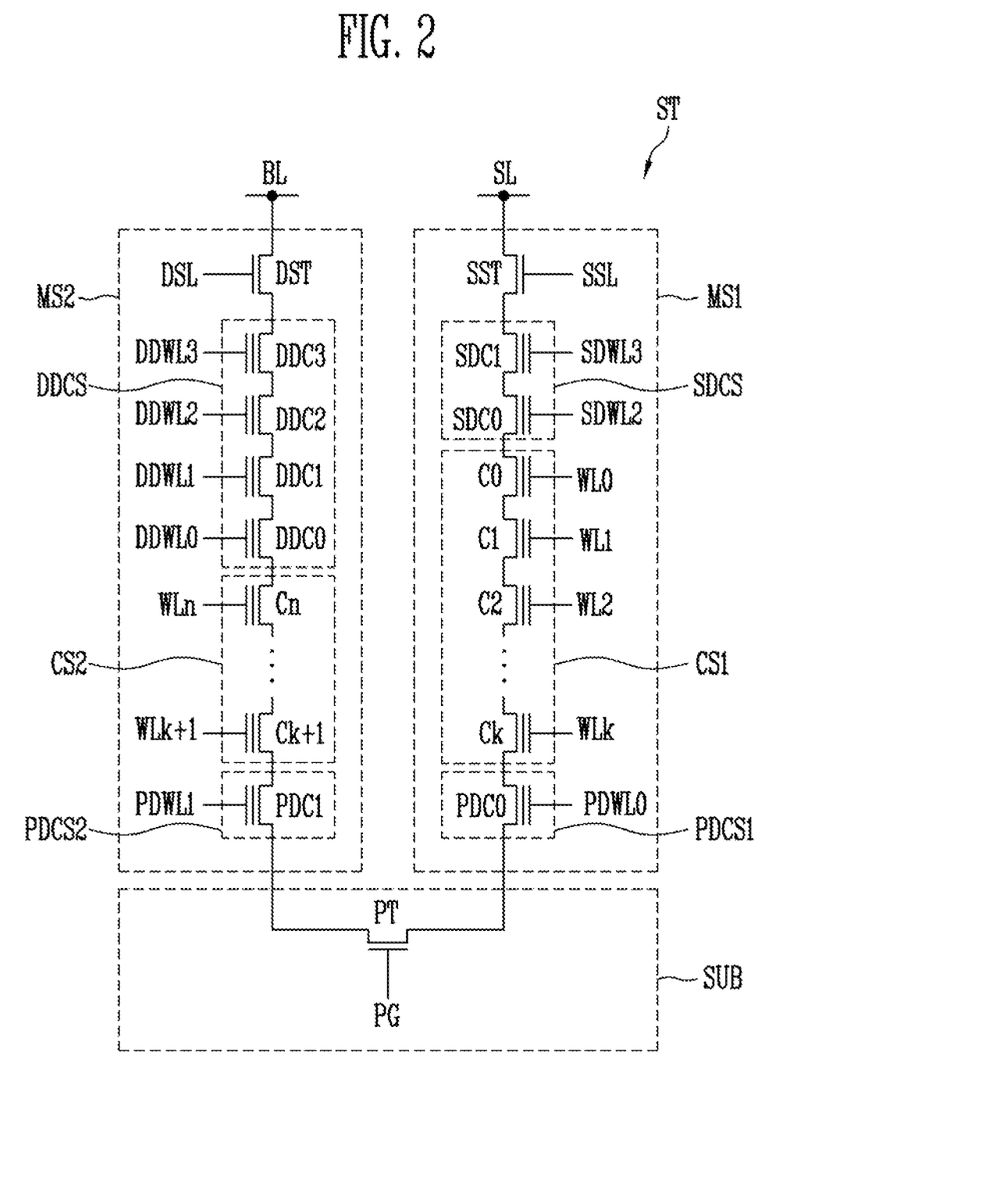
FIG. 2 is a circuit diagram illustrating a memory string according to an exemplary embodiment of the present invention.

Hereinafter, the connection between the main memory cells and the dummy memory cells included in the memory block will be described. FIG. 2 is a circuit diagram illustrating a memory string according to an exemplary embodiment of the present invention.

Referring to FIG. 2, a memory string ST is connected between the bit line BL and the common source line SL. The memory string ST includes a first memory string MS1, a second memory string MS2, and a pipe transistor PT. The first memory string MS1 is vertically connected between the pipe transistor PT and the common source line SL. The pipe transistor PT is formed on a semiconductor substrate SUB. The common source line SL is disposed on an upper portion of the semiconductor substrate SUB. The second memory string MS2 is vertically connected between the pipe transistor PT formed on the semiconductor substrate SUB and the bit line BL disposed on the upper portion of the semiconductor substrate SUB.

The first memory string MS1 may include a plurality of first main memory cells C0 to Ck and a plurality of first dummy memory cells SDC0, SDC1 and PDC0. The first main memory cells C0 to Ck and the first dummy memory cells SDC0, SDC1, and PDC0 are vertically connected between the pipe transistor PT and the common source line SL. The second memory string MS2 may include a plurality of second main memory cells Ck+1 to Cn and a plurality of second dummy memory cells DDC0 to DDC3 and PDC1. The second main memory cells Ck+1 to Cn and the second dummy memory cells DDC0 to DDC3 and PDC1 are vertically connected between the pipe transistor PT and the bit line BL.

The first main memory cells C0 to Ck are operated based on the voltages applied to the word lines WL0 to WLk. The first dummy memory cells SDC0, SDC1, and PAC0 are operated based on the voltages applied to the dummy word lines SDWL0, SDWL1, and PDWL0. The second main memory cells Ck+1 to Cn are operated based on the voltages applied to the word lines WLk+1 to WLn. The second dummy memory cells DDC0 to DDC3, and PDC1 are operated based on the voltages applied to the dummy word lines DDWL0 to DDWL3 and PDWL1. The pipe transistor PT is operated based on the voltage applied to a pipe gate PG.

In particular, the first memory string MS1 includes a source dummy memory string SDCS, a first main memory string CS1, and a first pipe dummy memory string PDCS1. The source dummy memory string SDCS may include a plurality of source dummy memory cells SDC0 and SDC1 connected to the common source line SL. The first pipe dummy memory string PDCS1 may include a first pipe dummy memory cell PDC0 connected to a source of the pipe transistor PT. The first main memory string CS1 includes a plurality of main memory cells C0 to Ck connected between the source dummy memory cells SDC0 and SDC1 and the first pipe dummy memory cell PDC0.

A source select transistor SST may further be connected between the source dummy memory cells SDC0 and SDC1 and the common source line SL. The source select transistor SST is operated based on the voltage applied to the source select line SSL. That is, the first memory string MS1 may further include the source select transistor SST.

The second memory string MS2 includes a drain dummy memory string DDCS, a second main memory string CS2, and a second pipe dummy memory string PDCS2. The drain dummy memory string DDCS may include a plurality of drain dummy memory cells DDC0 to DDC3 connected to the bit line BL. The second pipe dummy memory string PDCS2 may include a second pipe dummy memory cell PDC1 connected to a drain of the pipe transistor PT. The second main memory string CS2 includes a plurality of main memory cells Ck+1 to Cn connected between the drain dummy memory cells DDC0 to DDC3 and the second pipe dummy memory cell PDC1.

A drain select transistor DST may further be connected between the drain dummy memory cells DDC0 to DDC3 and the bit line BL. The drain select transistor DST is operated based on the voltage applied to the drain select line DSL. That is, the second memory string MS2 may further include the drain select transistor DST.

In particular, the number second dummy memory cells DDC0 to DDC3 and PDC1 is greater than the number of the first dummy memory cells SDC0, SDC1, and PDC0. More particularly the number of the drain dummy memory cells DDC0 to DDC3 of the drain dummy memory string DDCS connected to the bit line BL is greater than the number of the source dummy memory cells SDC0 and SDC1 of the source dummy memory string SDCS connected to the common source line SL. However, the number of the first pipe dummy memory cells PDC0 included in the first pipe dummy memory string PDCS1 may be equal to the number of the second pipe dummy memory cells PDC1 included in the second pipe dummy memory string PDCS2. Alternatively, the first pipe dummy memory string PDCS1 and the second pipe dummy memory string PDCS2 may be omitted.

Also, the number of the first main memory cells C0 to Ck is greater than the number of the second main memory cells Ck+1 to Cn. However, the number of the first main memory cells C0 to Ck and the first dummy memory cells SDC0, SDC1, and PDC0 included in the first memory string MS1 may preferably be equal to the number of the second main memory cells Ck+1 to Cn and the second dummy memory cells DDC0 to DDC3 and PDC1 included in the second memory string MS2.

As a whole, the number of the memory cells SDC0, SDC1, C0 to Ck, and PDC0 included in the first memory strings MS1 may preferably be equal to the number of the memory cells DDC0 to DDC3, Ck+1 to Cn, and PDC1 included in the second memory strings MS2.

The number of the source dummy memory cells SDC0 and SDC1 connected to the common source line SL through the source select transistor SST in the first: memory string MS1 is smaller than the number of the drain dummy memory cells DDC0 to DDC3 connected to the bit line BL through the drain select transistor DST in the second memory string MS2. Thus, a lowermost drain dummy memory cell DDC0 of the drain dummy memory cells is disposed at a lower level than a lowermost source dummy memory cell SDC0 of the source dummy memory cells. An uppermost memory cell C0 of the first main memory cells connected to the source dummy memory cells SDC0 and SDC1 in the first memory string MS1 is disposed at a higher level than an uppermost memory cell Cn of the second main memory cells connected to the drain dummy memory cells DDC0 to DDC3 in the second memory string MS2.

When the memory string is formed in a U-shape, disturbance characteristics of the main memory cell Cn connected to the drain select transistor DST may be degraded by hot carrier injection (HCl). In order to prevent the degradation of the U-shaped memory string, the drain dummy memory cells DDC0 and DDC3 are additionally connected between the drain select transistor DST and the main memory cell Cn. When the drain dummy memory cells DDC0 and DDC3 are interposed between the drain select transistor DST and the main memory cell Cn, the same number of the source dummy memory cells may also be interposed between the source select transistor SST and the main memory cell C0. However, the main memory cell C0 connected to the source select transistor SST is less influenced by the HCl than the main memory cell Cn connected to the drain select transistor DST. Thus, the number of the source dummy memory cells between the source select transistor SST and the main memory cell C0 may be decreased.

Therefore, when a predetermined number of the dummy memory cells are interposed, the number of the drain dummy memory cells between the drain select transistor DST and the main memory cell Cn may preferably be greater than the number of the source dummy memory cells between the source select transistor SST and the main memory cell C0. As shown in FIG. 2, when six dummy memory cells are interposed, four drain dummy memory cells are interposed between the drain select transistor DST and the main memory cell Cn, and two source dummy memory cells SDC0 and SDC1 are interposed between the source select transistor SST and the main memory cell C0.

When the above-mentioned structure of FIG. 2 is compared with a comparative structure having three source dummy memory cells interposed between the source select transistor SST and the main memory cell C0 and three drain dummy memory cells interposed between the drain select transistor DST and the main memory cell Cn, the operation circuits 120 to 170 (shown in FIG. 1) recognize the lowermost source dummy memory cell of the three source dummy memory cells as a main memory cell, and recognize a main memory cell adjacent to the three drain dummy memory cells as another lowermost drain dummy memory cell.

According the memory string ST, the dummy memory cells SDC0, SDC1, DDC0 to DDC3 are connected to the main memory cells C0 to Cn. Thus, the number of the drain dummy memory cells DDC0 to DDC3 between the drain select transistor DST and the main memory cell Cn may be increased, although the total number of the memory cells in the memory string ST is not increased. Therefore, electrical characteristics of the main memory cell Cn may be improved.

Figure 3:
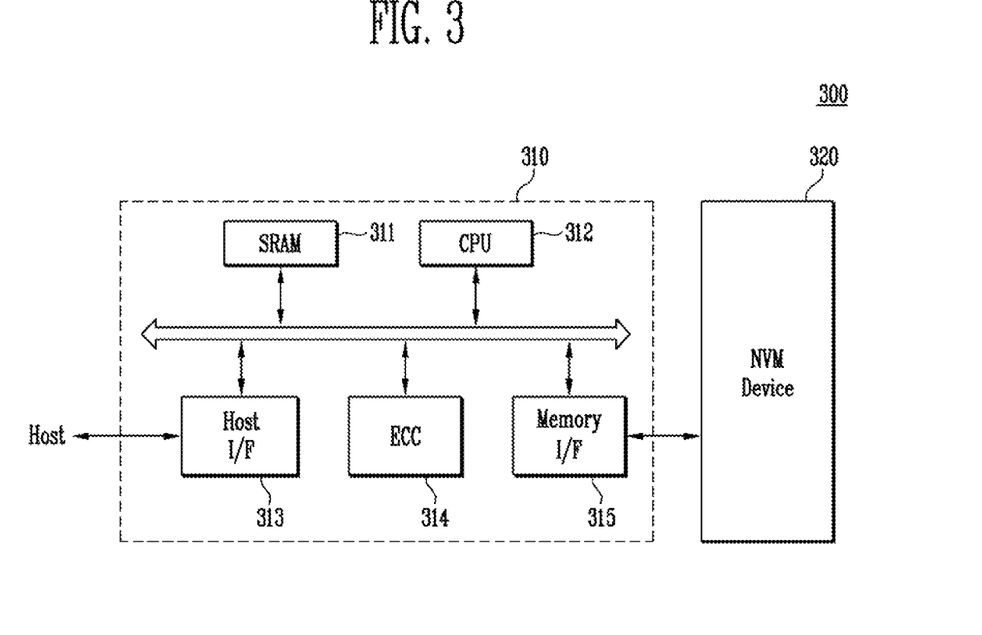
FIG. 3 is a block diagram illustrating a memory system according to an exemplary embodiment of the present invention.

FIG. 3 is a block diagram illustrating a memory system according to an exemplary embodiment of the present invention.

Referring to FIG. 3, the memory system 300 includes a nonvolatile memory device 320 and a memory controller 310.

The nonvolatile memory device 320 includes the memory string shown in FIG. 2. The memory controller 1310 includes a static random access memory device (SRAM) 311, a central processing unit (CPU) 312, a host interface (I/F) 313, an error correcting code block (ECC) 314, a memory interface (I/F) 315. The memory controller 310 controls the nonvolatile memory device 320. The nonvolatile memory device 320 may be combined with the memory controller 310 to be used for a memory card or a semiconductor disk device such as s solid state disk (SSD). The SRAM 311 is used for an operational memory of the central processing unit 312. The host interface 313 includes a data exchange protocol of a host coupled to the memory system 300. The error correcting code block 314 detects and corrects errors in the data read from a cell region of the nonvolatile memory device 320. The memory interface 314 interfaces with the nonvolatile memory device 320. The central processing unit 312 performs general control operations for exchanging data with the memory controller 310.

As not shown in FIG. 3, the memory system 300 may further include a ROM (not shown) for storing code data for interfacing with a host, etc. A person skilled in the art will understand the memory system 300 may have various elements. The nonvolatile memory device 320 may include a multi-chip package having a plurality of flash memory chips. The memory system 300 may be used for a storage medium of high reliability and improved operating characteristics. In particular, the nonvolatile (or flash) memory device of the present invention may be used for a memory system such as a semiconductor disk device (for example, an SSD) that has been actively studied. The memory controller 310 may communicate with an outside (for example, a host) through one of various protocols such as USB, MMC, PCI-E, SATA, RATA, SCSI, ESDI, IDE, etc.

Figure 4:
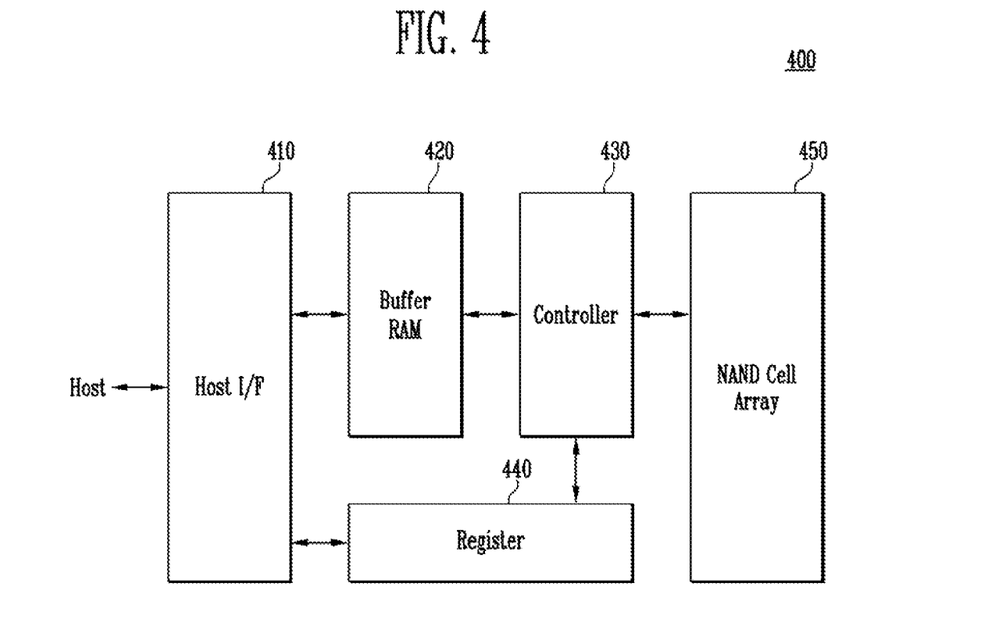
FIG. 4 is a block diagram illustrating a fusion memory device of a fusion memory system performing a program operation according to an exemplary embodiment of the present invention.

FIG. 4 is a block diagram illustrating a fusion memory device of a fusion memory system performing a program operation according to an exemplary embodiment of the present invention. For example, the present invention may be applied to a fusion memory device such as a one NAND flash memory device 400.

The one NAND flash memory device 400 includes a host interface (I/F) 410, a buffer RAM 420, a controller 430, a register 440, and a NAND cell array 450. The host interface 410 exchanges information with other devices using different protocols. The buffer RAM 420 includes a core configured to drive the memory device or temporarily store data. The controller 430 controls reading, programming and other operations in response to an externally received control signal and a command. The register 440 stores data such as the command, address, and configurations for defining system operational status in the memory device. The NAND cell array 450 includes an operation circuit having a nonvolatile memory cell and a page buffer. The one NAND flash memory device 400 programs data in a general method in response to the writing request of the host.

Figure 5:
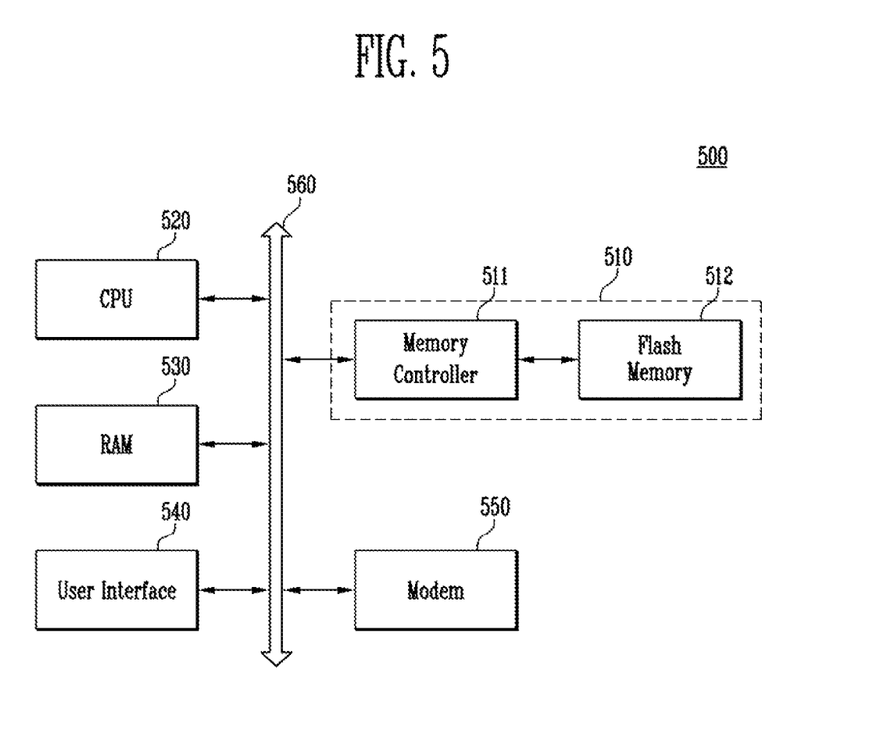
FIG. 5 is a block diagram illustrating a computing system including a flash memory device according to an exemplary embodiment of the present invention.

FIG. 5 is a block diagram illustrating a computing system including a flash memory device according to an exemplary embodiment of the present invention.

The computing system 500 includes a CPU (for example, a microprocessor) 520, a RAM 530, a user interface 540, a modern 550 such as a baseband chipset, and a memory system 510, which are connected to a system bus 560. When the computing system 500 is a mobile device, the computing system 500 may further include a battery (not shown) configured to supply driving power. Although not shown in FIG. 5, the computing system 500 may further include an application chipset, a camera image processor (CIS), a mobile DRAM, etc. A person skilled in the art will understand the computing system 500 may have various other elements. For example, the memory system 510 may include a solid state drive/disk (SSD) including the nonvolatile memory device shown in FIG. 1. Alternatively, the memory system 510 may include a fusion flash memory (for example, a NAND flash memory device as shown in FIG. 4).

In the drawings and specification, there have been disclosed typical exemplary embodiments of the invention and, although specific terms are employed, they are used in a generic and descriptive sense only and not for purpose of limitation. As for the scope of the invention, it is to be set forth in the following claims. Therefore, it will be understood by those of ordinary skill in the art that various changes in form and detail may be made without departing from the spirit and scope of the present invention as defined by the following claims.

What is claimed is:

1. A semiconductor device comprising:
   a first memory string including a plurality of first main memory cells formed on a pipe transistor of a semiconductor substrate and a plurality of first dummy memory cells connected between the first main memory cells and a common source line; and
   a second memory string including a plurality of second main memory cells formed on the pipe transistor and a plurality of second dummy memory cells connected between the second main memory cells and a bit line,
   wherein the number of the second dummy memory cells is greater than the number of the first dummy memory cells.

2. The semiconductor device of claim 1, wherein the first memory string further comprises:
   a first pipe dummy memory cell connected between the pipe transistor and the first main memory cells.

3. The semiconductor device of claim 1, wherein the second memory string further comprises:
   a second pipe dummy memory cell connected between the pipe transistor and the second main memory cells.

4. The semiconductor device of claim 1, wherein the first memory string further comprises:
   a source select transistor connected between the common source line and the first dummy memory cells.

5. The semiconductor device of claim 1, wherein the second memory string further comprises:
   a drain select transistor connected between the bit line and the second dummy memory cells.

6. The semiconductor device of claim 2, wherein a lowermost dummy memory cell of the second dummy memory cells is disposed at a lower level than a lowermost dummy memory cell of the first dummy memory cells.

7. The semiconductor device of claim 1, wherein the number of the first main memory cells is greater than the number of the second main memory cells.

8. The semiconductor device of claim 1, wherein an uppermost memory cell of the first main memory cells is disposed at a higher level than an uppermost memory cell of the second main memory cells.

9. A semiconductor device comprising:
   a first memory string including a plurality of first main memory cells and a plurality of first dummy memory cells vertically connected between a pipe transistor formed on a semiconductor substrate and a common source line; and
   a second memory string including a plurality of second main memory cells and a plurality of second dummy memory cells vertically connected between the pipe transistor and a bit line,
   wherein the number of the first main memory cells is greater than the number of the second main memory cells.

10. The semiconductor device of claim 9, wherein the number of the second dummy memory cells is greater than the number of the first dummy memory cells.

11. The semiconductor device of claim 9, wherein the number of the first main memory cells and the first dummy memory cells is equal to the number of the second main memory cells and the second dummy memory cells.

12. The semiconductor device of claim 9, wherein the first dummy memory cells comprise:
    a plurality of source dummy memory cells connected between the common source line and the first main memory cells; and
    a first pipe dummy memory cell connected between the pipe transistor and the first main memory cells.

13. The semiconductor device of claim 9, wherein the second dummy memory cells comprise:
    a plurality of drain dummy memory cells connected between the bit line and the first main memory cells; and
    a second pipe dummy memory cell connected between the pipe transistor and the second main memory cells.

14. The semiconductor device of claim 9, wherein the first and second main memory cells store data and output stored data through a program loop, a read operation, and an erase loop.

15. A semiconductor device comprising:
    a memory block including a plurality of dummy memory cells and a plurality of main memory cells connected between a bit line and a common source line, wherein the number of first dummy memory cells connected to the common source line is smaller than the number of second dummy memory cells connected to the bit line, among the dummy memory cells; and
    a control circuit configured to utilize a portion of the dummy memory cells adjacent to the main memory cells as the main memory cells, and a portion of the main memory cells adjacent to the dummy memory cells to function as the dummy memory cells when performing a program loop, a read operation, and an erase loop of the main memory cells.

16. The semiconductor device of claim 15, further comprising:
    a pipe transistor connected between the main memory cells.

17. The semiconductor device of claim 16, wherein the number of first main memory cells connected between the pipe transistor and the first dummy memory cells is greater than the number of second main memory cells connected between the pipe transistor and the second dummy memory cells.

18. The semiconductor device of claim 16, further comprising:
    a plurality of pipe dummy memory cells connected between the pipe transistor and the main memory cells.

* * * * *